(12) United States Patent
Muramatsu et al.

(10) Patent No.: US 9,810,987 B2
(45) Date of Patent: Nov. 7, 2017

(54) SUBSTRATE TREATMENT METHOD, COMPUTER STORAGE MEDIUM AND SUBSTRATE TREATMENT SYSTEM

(71) Applicant: Tokyo Electron Limited, Tokyo (JP)

(72) Inventors: Makoto Muramatsu, Koshi (JP); Takahiro Kitano, Koshi (JP); Tadatoshi Tomita, Koshi (JP); Takanori Nishi, Koshi (JP); Shinichiro Kawakami, Koshi (JP); Takashi Yamauchi, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 24 days.

(21) Appl. No.: 14/896,415

(22) PCT Filed: Jun. 6, 2014

(86) PCT No.: PCT/JP2014/065087
§ 371 (c)(1),
(2) Date: Dec. 7, 2015

(87) PCT Pub. No.: WO2014/208311
PCT Pub. Date: Dec. 31, 2014

(65) Prior Publication Data
US 2016/0124307 A1    May 5, 2016

(30) Foreign Application Priority Data

Jun. 26, 2013   (JP) ................. 2013-133383

(51) Int. Cl.
*G03F 7/004*    (2006.01)
*G03F 7/20*    (2006.01)
(Continued)

(52) U.S. Cl.
CPC ............... *G03F 7/20* (2013.01); *C08L 53/00* (2013.01); *C09D 153/00* (2013.01);
(Continued)

(58) Field of Classification Search
CPC . G03F 7/002; G03F 7/168; G03F 7/32; G03F 7/40; C09D 153/00; C08L 53/00;
(Continued)

(56) References Cited

U.S. PATENT DOCUMENTS 8,900,467 B1 * 12/2014 Chapuis .................... C08J 7/02
216/41
9,349,604 B2 * 5/2016 Rathsack .................. G03F 7/42
(Continued)

FOREIGN PATENT DOCUMENTS

JP    2012-061531 A    3/2012
JP    2012-064878 A    3/2012
(Continued)

OTHER PUBLICATIONS

International Search Report of the International Searching Authority dated Sep. 2, 2014 for the corresponding international application No. PCT/JP2014/065087 (and English translation).
(Continued)

*Primary Examiner* — Amanda C Walke
(74) *Attorney, Agent, or Firm* — Posz Law Group, PLC

(57) ABSTRACT

A substrate treatment method includes: a polymer separation step of phase-separating a block copolymer into a hydrophilic polymer and a hydrophobic polymer; and a polymer removal step of selectively removing the hydrophilic polymer from the phase-separated block copolymer, wherein in the polymer removal step, the hydrophilic polymer is removed by: irradiating the phase-separated block copolymer with an energy ray; then supplying a first polar organic solvent having a first degree of dissolving the hydrophilic polymer, being lower in boiling point than water and capable of dissolving water, and not dissolving the hydrophobic polymer, to the block copolymer; and then supplying a second polar organic solvent having a second dissolving
(Continued)

degree lower than the first dissolving degree, being higher in boiling point than water, and not dissolving the hydrophobic polymer, to the block copolymer.

5 Claims, 10 Drawing Sheets

(51) Int. Cl.
  *C08L 53/00*    (2006.01)
  *C09D 153/00*    (2006.01)
  *H01L 21/027*    (2006.01)
  *G03F 7/32*    (2006.01)
  *H01L 21/02*    (2006.01)
  *G03F 7/40*    (2006.01)
  *H01L 21/308*    (2006.01)
  *H01L 21/311*    (2006.01)
  *H01L 21/67*    (2006.01)
  *G03F 7/16*    (2006.01)
  *G03F 7/00*    (2006.01)

(52) U.S. Cl.
  CPC .............. *G03F 7/0002* (2013.01); *G03F 7/16* (2013.01); *G03F 7/32* (2013.01); *G03F 7/40* (2013.01); *H01L 21/0274* (2013.01); *H01L 21/02282* (2013.01); *H01L 21/3086* (2013.01); *H01L 21/31133* (2013.01); *H01L 21/6708* (2013.01); *H01L 21/67028* (2013.01); *H01L 21/67051* (2013.01); *B81C 2201/0149* (2013.01)

(58) Field of Classification Search
  CPC ........... H01L 21/0274; H01L 21/02282; B81C 2201/0149
  USPC ............ 524/505; 428/195.1; 430/270.1, 434, 430/435
  See application file for complete search history.

(56) References Cited

U.S. PATENT DOCUMENTS

| 9,514,938 | B2* | 12/2016 | Sato ..................... H01L 21/0332 |
| 9,523,917 | B2* | 12/2016 | Ban ........................ C08F 293/00 |
| 9,541,830 | B2* | 1/2017 | Ober ..................... C08F 214/18 |
| 2014/0127910 | A1* | 5/2014 | Hieno ................. H01L 21/3081 438/703 |
| 2014/0238954 | A1* | 8/2014 | Matsumiya .......... C09D 153/00 216/67 |
| 2015/0072292 | A1* | 3/2015 | Cho ........................ C08G 61/08 430/285.1 |
| 2015/0205207 | A1* | 7/2015 | Seshimo ................... G03F 7/11 430/324 |
| 2015/0255271 | A1* | 9/2015 | Muramatsu ......... H01L 21/0271 355/27 |
| 2015/0331313 | A1* | 11/2015 | Navarro .................. C08L 53/00 430/5 |
| 2016/0304740 | A1* | 10/2016 | Cheng ................. C09D 169/00 |

FOREIGN PATENT DOCUMENTS

| JP | 2012-166302 A | 9/2012 |
| JP | 2013-072896 A | 4/2013 |
| WO | 2012/111694 A1 | 8/2012 |

OTHER PUBLICATIONS

Dammel, Ralph, "Cost-Effective Sub-20 nm Lithography: Smart Chemicals to the Rescue", Journal of Photopolymer Science and Technology, vol. 24, No. 1, Jan. 2011, pp. 33-42. (Discussed on p. 3 of the specification).

* cited by examiner (a)  (b)  (c)

SUBSTRATE TREATMENT METHOD, COMPUTER STORAGE MEDIUM AND SUBSTRATE TREATMENT SYSTEM

TECHNICAL FIELD

This application is based upon and claims the benefit of priority of the prior Japanese Patent Application No. 2013-133383, filed in Japan on Jun. 26, 2013, the entire contents of which are incorporated herein by reference.

The present invention relates to a substrate treatment method, a computer storage medium and a substrate treatment system, using a block copolymer containing a hydrophilic (polar) polymer having a hydrophilic property (polarity) and a hydrophobic (nonpolar) polymer having a hydrophobic property (no polarity).

BACKGROUND ART

For example, in a manufacturing process of a semiconductor device, photolithography processing is performed in which a resist coating treatment of applying a resist solution onto, for example, a semiconductor wafer (hereinafter, referred to as a "wafer") to form a resist film, exposure processing of exposing the resist film to a predetermined pattern, a developing treatment of developing the exposed resist film and so on are performed in sequence to form a predetermined resist pattern on the wafer. Then, using the resist pattern as a mask, an etching treatment is performed on a film to be treated on the wafer and a removal treatment of the resist film is then performed, to form a predetermined pattern in the film to be treated.

Incidentally, miniaturization of the above-described pattern of the film to be treated is required in recent years for higher integration of the semiconductor device. Therefore, miniaturization of the resist pattern is in progress and, for example, the wavelength of light for the exposure processing in the photolithography processing is being reduced. However, there are technical and cost limits in reducing the wavelength of an exposure light source, and it is now difficult to form a fine resist pattern at a level of, for example, several nanometers only by the method of increasingly reducing the wavelength of light.

Hence, there is a proposed wafer treatment method using a block copolymer composed of two kinds of polymers (Non-Patent Document 1). In this method, first, a resist pattern is formed on an anti-reflection film of the wafer, and then a neutral layer having an intermediate affinity to a hydrophilic polymer and a hydrophobic polymer is formed on the anti-reflection film and the resist pattern. Thereafter, the neutral layer on the resist pattern is removed using the resist pattern as a mask, and then the resist pattern itself is also removed. Thus, a pattern of the neutral layer is formed on the anti-reflection film of the wafer, and then a block copolymer is applied onto the anti-reflection film and the pattern-formed neutral layer. Then, the hydrophilic polymer and the hydrophobic polymer are phase-separated from the block copolymer so that the hydrophilic polymer and the hydrophobic polymer are alternately and regularly arranged on the neutral layer.

Thereafter, by removing, for example, the hydrophilic polymer, a fine pattern of the hydrophobic polymer is formed on the wafer. Then, using the pattern of the hydrophobic polymer as a mask, an etching treatment of a film to be treated is performed to thereby form a predetermined pattern in the film to be treated.

Incidentally, the pattern formation using the block copolymer is used also when forming a contact hole being a fine through hole for performing wiring between stacked wafers in a three-dimensional integration technology of stacking devices in three dimensions. This contact hole is a columnar hole pattern vertical to the upper surface of the wafer.

In the case of forming the hole pattern using the block copolymer, a columnar hole pattern is first formed of a resist film on the wafer. Then, the lock copolymer is applied to the wafer on which the hole pattern is formed. Thereafter, the block copolymer is phase-separated into the hydrophilic polymer and the hydrophobic polymer, whereby in a hole pattern 601 of a resist film 600 formed on the wafer W, the block copolymer is phase-separated into a columnar hydrophilic polymer 602 and a cylindrical hydrophobic polymer 603 to be concentric with the hole pattern 601 as illustrated in FIG. 16 and FIG. 17. In this case, the hole pattern 601 of the resist film 600 functions as a guide for forming a pattern by the hydrophilic polymer 602 and the hydrophobic polymer 603.

Subsequently, for example, by removing the hydrophilic polymer 602 located inside the concentric circle, a cylindrical pattern is formed of the remaining hydrophobic polymer 603. Then, by performing an etching treatment using the hydrophobic polymer 603 as a mask, the contact hole being a fine through hole is formed.

PRIOR ART DOCUMENT

Patent Document

[Non-Patent Document 1] "Cost-Effective Sub-20 nm Lithography: Smart Chemicals to the Rescue", Ralph R. Dammel, Journal of Photopolymer Science and Technology Volume 24, Number 1 (2011) 33-42

DISCLOSURE OF THE INVENTION

Problems to be Solved by the Invention

Incidentally, for selectively removing the hydrophilic polymer in the pattern formation using the block copolymer as described above, so-called dry etching using a plasma treatment or so-called wet etching using an organic solvent is used. In the dry etching, a selection ratio between the hydrophilic polymer and the hydrophobic polymer is, for example, about 3 to 7:1, whereas in the so-called wet etching using the organic solvent, the hydrophobic polymer rarely dissolves in the organic solvent because it has no polarity, so that film thinning can be avoided. Therefore, the wet etching is advantageous in the pattern formation.

However, the present inventors have confirmed that in the case where the hydrophilic polymer is removed using the wet etching, for example, when forming a contact hole, the contact hole itself is successfully formed, but many defects seemed to be caused by watermarks are generated on the wafer.

After earnest study by the present inventors about this point, it has been found that the cause of generation of the watermarks is moisture in the air dissolved in the organic solvent used for removing the hydrophilic polymer. Hereinafter, the cause will be concretely described.

When the phase-separated block copolymer is irradiated with, for example, an ultraviolet ray as an energy ray and is supplied with isopropyl alcohol (IPA) as an organic solvent for removing a hydrophilic polymer, the hydrophilic polymer 602 becomes a state dissolved in an organic solvent R as illustrated in FIG. 18(a). In this event, IPA used as the organic solvent R is capable of dissolving water, and therefore moisture A in the air dissolves into the organic solvent R. In particular, since moisture becomes more likely to condense at the interface between the organic solvent R and the air due to heat of evaporation when the organic solvent R evaporates, the moisture in the air is supposed to easily dissolve into the organic solvent R.

Then, as time passes, the organic solvent R gradually evaporates as in FIG. 18(b), but IPA used as the organic solvent R is lower in boiling point than water and therefore dries before water. As a result, the moisture concentration in the organic solvent R increases and the hydrophilic polymer 602 in the organic solvent R comes to precipitate. Then, the precipitated hydrophilic polymer 602 remains, on the wafer W, in a state of being captured by water A remaining after the drying of the organic solvent R, and is considered to become the watermark, for example, as illustrated in FIG. 18(c).

Hence, the present inventors has thought that if IPA is supplied to dissolve the hydrophilic polymer and then an organic solvent higher in boiling point than water though inferior to IPA in degree of dissolving the hydrophilic polymer is supplied to substitute for IPA, water in the organic solvent dries before the organic solvent, thereby making it possible to avoid an increase in moisture concentration in the organic solvent and, as a result, to prevent generation of the watermarks due to the precipitation of the hydrophilic polymer.

The present invention has been developed in consideration of the above points, and its object is to appropriately form a predetermined pattern on a substrate in a substrate treatment using a block copolymer containing a hydrophilic polymer and a hydrophobic polymer.

Means for Solving the Problems

To achieve the above object, the present invention is a method of treating a substrate using a block copolymer containing a hydrophilic polymer and a hydrophobic polymer, the substrate treatment method including: a neutral layer forming step of forming, on the substrate, a neutral layer having an intermediate affinity to the hydrophilic polymer and the hydrophobic polymer; a resist pattern forming step of performing exposure processing on a resist film formed on the neutral layer, and then developing the resist film after the exposure processing to form a resist pattern; a block copolymer coating step of applying the block copolymer to the substrate after formation of the resist pattern; a polymer separation step of phase-separating the block copolymer into the hydrophilic polymer and the hydrophobic polymer; and a polymer removal step of selectively removing the hydrophilic polymer from the phase-separated block copolymer. In the polymer removal step, the hydrophilic polymer is removed by: irradiating the phase-separated block copolymer with an energy ray; then supplying a first polar organic solvent having a first degree of dissolving the hydrophilic polymer, being lower in boiling point than water and capable of dissolving water, and not dissolving the hydrophobic polymer, to the block copolymer; and then supplying a second polar organic solvent having a second dissolving degree lower than the first dissolving degree, being higher in boiling point than water, and not dissolving the hydrophobic polymer, to the block copolymer.

According to the present invention, the first polar organic solvent is supplied to the block copolymer after irradiation with an energy ray, thereby first dissolving the hydrophilic polymer. Then, the second polar organic solvent higher in boiling point than water is supplied, so that the first polar organic solvent lower in boiling point than water is substituted by the second polar organic solvent while the first polar organic solvent is evaporating. Then, moisture dissolved in the first polar organic solvent evaporates before the second polar organic solvent after substitution, so that the moisture concentration in the second polar organic solvent decreases, resulting in suppression of precipitation of the hydrophilic polymer. Accordingly, wet etching of the hydrophilic polymer is successfully performed to appropriately form a predetermined pattern on the substrate.

According to the present invention in another aspect, there is provided a computer-readable storage medium storing a program running on a computer of a control unit controlling a substrate treatment system to cause the substrate treatment system to perform the substrate treatment method.

The present invention in still another aspect is a system of treating a substrate using a block copolymer containing a hydrophilic polymer and a hydrophobic polymer, the substrate treatment system including: a neutral layer forming apparatus that forms, on the substrate, a neutral layer having an intermediate affinity to the hydrophilic polymer and the hydrophobic polymer; a developing apparatus that develops a resist film after exposure processing formed on the neutral layer to form a resist pattern; a block copolymer coating apparatus that applies the block copolymer to the substrate after formation of the resist pattern; a polymer separation apparatus that phase-separates the block copolymer into the hydrophilic polymer and the hydrophobic polymer; a modification treatment apparatus that irradiates the phase-separated block copolymer with an energy ray; and a polymer removing apparatus that selectively removes the hydrophilic polymer from the phase-separated block copolymer. The polymer removing apparatus includes: a first supply unit that supplies a first polar organic solvent having a first degree of dissolving the hydrophilic polymer, being lower in boiling point than water and capable of dissolving water, and not dissolving the hydrophobic polymer, to the block copolymer; and a second supply unit that supplies a second polar organic solvent having a second dissolving degree lower than the first dissolving degree, being higher in boiling point than water, and not dissolving the hydrophobic polymer, to the block copolymer.

Effect of the Invention

According to the present invention, a predetermined pattern can be appropriately formed on a substrate in a substrate treatment using a block copolymer containing a hydrophilic polymer and a hydrophobic polymer.

BEST MODE FOR CARRYING OUT THE INVENTION

Figure 1:
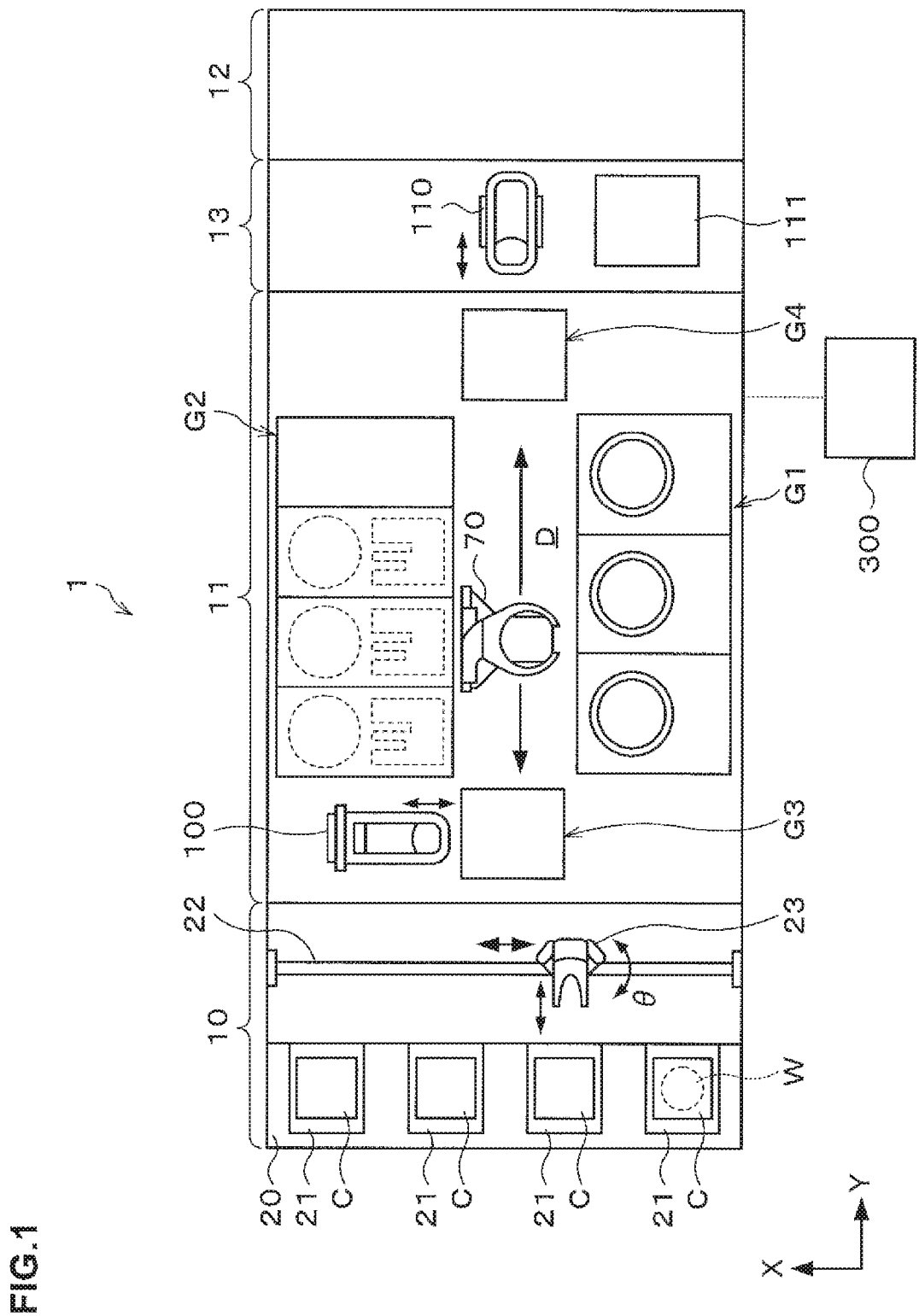
FIG. 1 A plan view illustrating the outline of a configuration of a substrate treatment system according to this embodiment.
Figure 2:
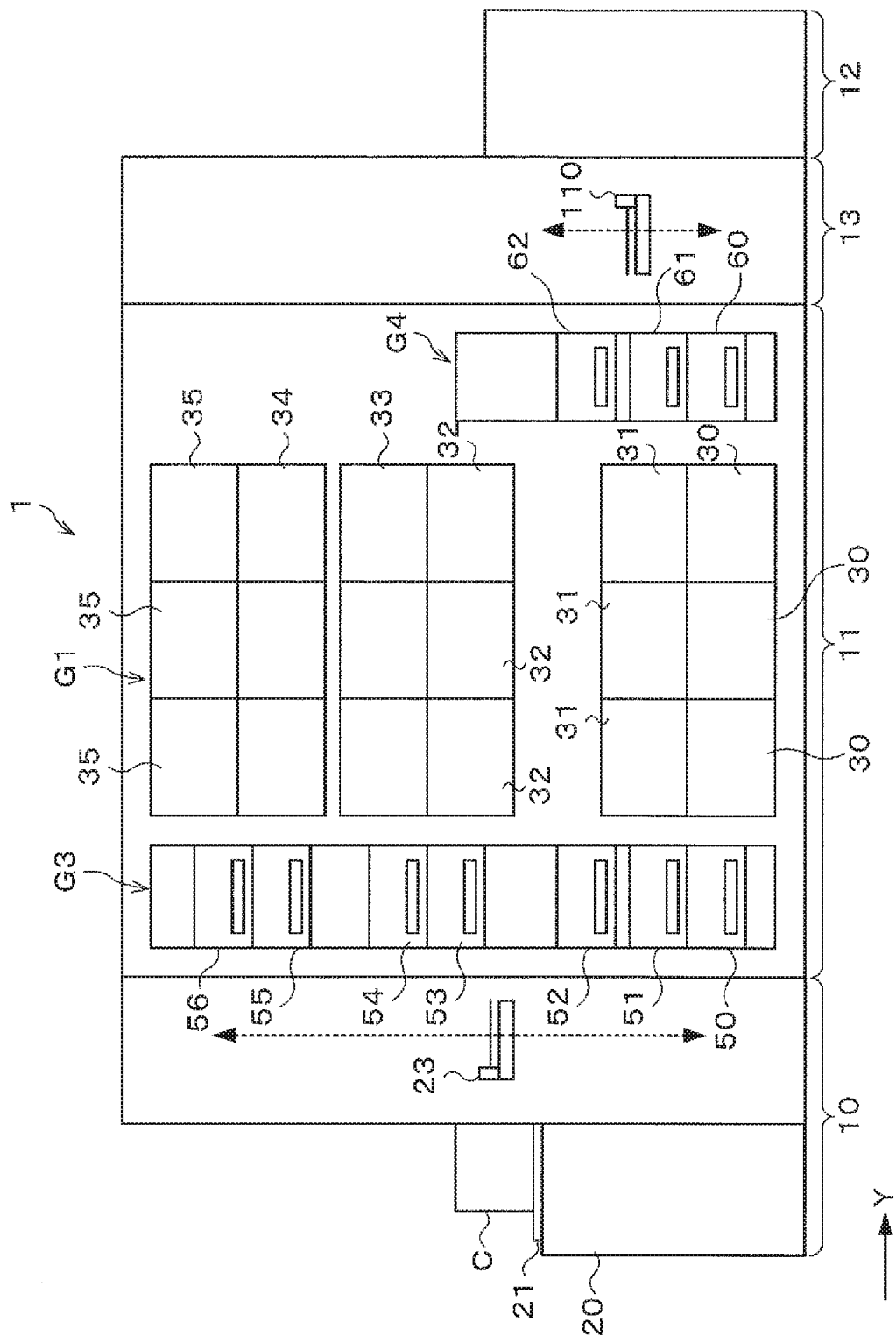
FIG. 2 A side view illustrating the outline of the configuration of the substrate treatment system according to this embodiment.
Figure 3:
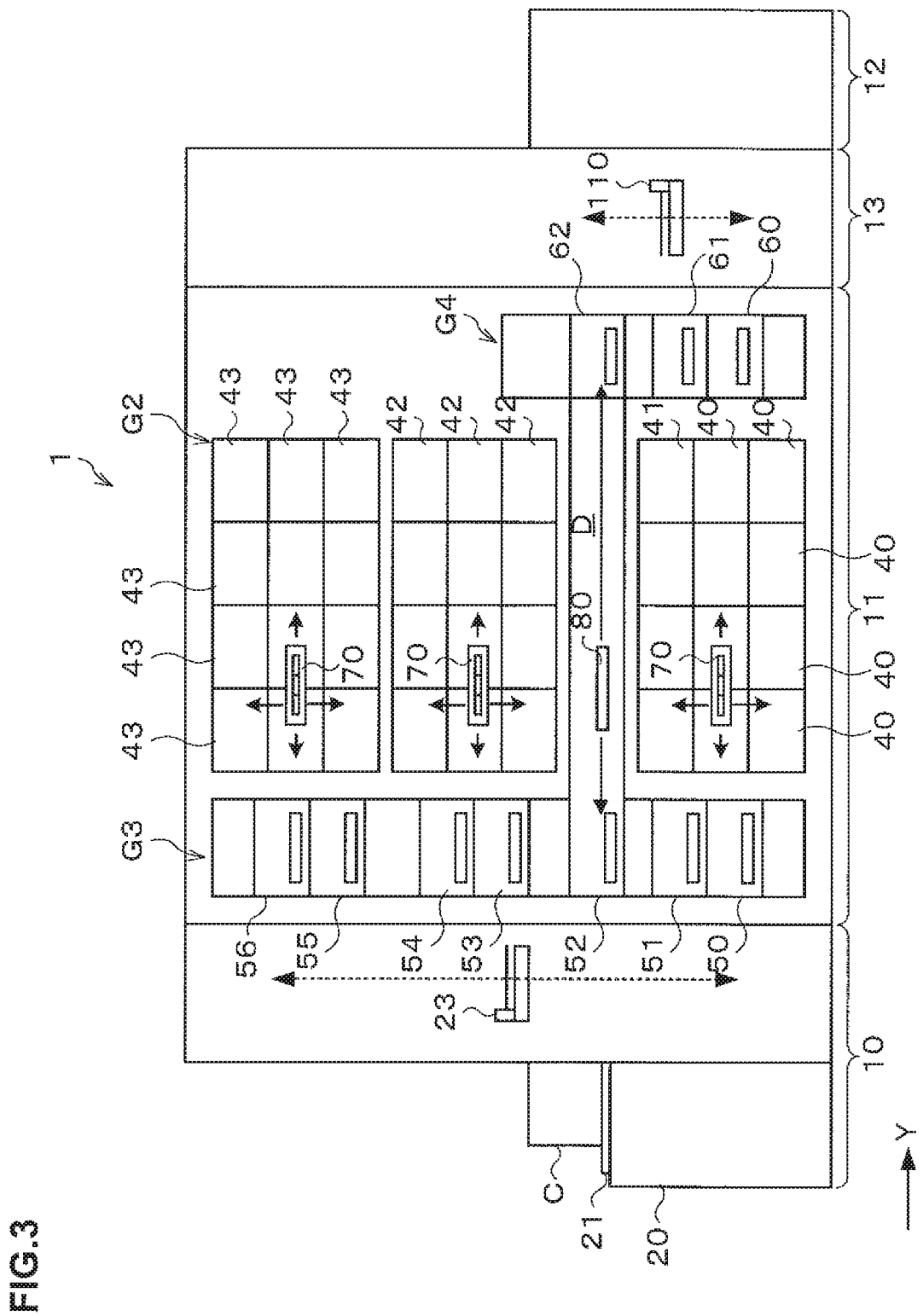
FIG. 3 A side view illustrating the outline of the configuration of the substrate treatment system according to this embodiment.

Hereinafter, an embodiment of the present invention will be described. FIG. 1 is an explanatory view illustrating the outline of a configuration of a substrate treatment system 1 that performs a substrate treatment method according to this embodiment. FIG. 2 and FIG. 3 are side views illustrating the outline of an internal configuration of the substrate treatment system 1.

The substrate treatment system 1 has, as illustrated in FIG. 1, a configuration in which a cassette station 10 into/out of which a cassette C housing a plurality of wafers W is transferred, a treatment station 11 which includes a plurality of various treatment apparatuses which perform predetermined treatments on the wafer W, and an interface station 13 which delivers the wafer W to/from an exposure apparatus 12 adjacent to the treatment station 11, are integrally connected.

In the cassette station 10, a cassette mounting table 20 is provided. The cassette mounting table 20 is provided with, a plurality of cassette mounting plates 21 on which the cassettes C are mounted when the cassettes C are transferred in/out from/to the outside of the substrate treatment system 1.

In the cassette station 10, a wafer transfer apparatus 23 is provided which is movable on a transfer path 22 extending in the X-direction as illustrated in FIG. 1. The wafer transfer apparatus 23 is movable also in a vertical direction and around a vertical axis (in a θ-direction), and can transfer the wafer W between the cassette C on each of the cassette mounting plates 21 and a later-described delivery apparatus in a third block G3 in the treatment station 11.

In the treatment station 11, a plurality of, for example, four blocks G1, G2, G3, G4 are provided each including various apparatuses. For example, the first block G1 is provided on the front side (X-direction negative direction side in FIG. 1) in the treatment station 11, and the second block G2 is provided on the rear side (X-direction positive direction side in FIG. 1) in the treatment station 11. Further, the third block G3 is provided on the cassette station 10 side (Y-direction negative direction side in FIG. 1) in the treatment station 11, and the fourth block G4 is provided on the interface station 13 side (Y-direction positive direction side in FIG. 1) in the treatment station 11.

For example, in the first block G1, as illustrated in FIG. 2, a plurality of solution treatment apparatuses, for example, developing apparatuses 30 each of which performs a developing treatment on the wafer W, organic solvent supply apparatuses 31 as polymer removing apparatuses each of which supplies an organic solvent onto the wafer W, anti-reflection film forming apparatuses 32 each of which forms an anti-reflection film on the wafer W, neutral layer forming apparatuses 33 each of which applies a neutralizing agent onto the wafer W to form a neutral layer, resist coating apparatuses 34 each of which applies a resist solution onto the wafer W to form a resist film, and block copolymer coating apparatuses 35 each of which applies a block copolymer onto the wafer W, are stacked in order from the bottom. Note that the organic solvent to be used in the organic solvent supply apparatuses 31 will be described later.

For example, three pieces of each of the developing apparatus 30, the organic solvent supply apparatus 31, the anti-reflection film forming apparatus 32, the neutral layer forming apparatus 33, the resist coating apparatus 34, and the block copolymer coating apparatus 35 are arranged side by side in the horizontal direction. Note that the numbers and the arrangement of the developing apparatuses 30, the organic solvent supply apparatuses 31, the anti-reflection film forming apparatuses 32, the neutral layer forming apparatuses 33, the resist coating apparatuses 34, and the block copolymer coating apparatuses 35 can be arbitrarily selected.

In the developing apparatus 30, the organic solvent supply apparatus 31, the anti-reflection film forming apparatus 32, the neutral layer forming apparatus 33, the resist coating apparatus 34, and the block copolymer coating apparatus 35, for example, spin coating of applying a predetermined coating solution onto the wafer W is performed. In the spin coating, the coating solution is discharged, for example, from a coating nozzle onto the wafer W and the wafer W is rotated to diffuse the coating solution over the front surface of the wafer W. The configurations of these solution treatment apparatuses will be described later.

Note that the block copolymer to be applied onto the wafer W in the block copolymer coating apparatus 35 has a first polymer and a second polymer. As the first polymer, a hydrophilic polymer having a hydrophilic property (polarity) is used, and as the second polymer, a hydrophobic polymer having a hydrophobic property (no polarity) is used. In this embodiment, for example, polymethyl methacrylate (PMMA) is used as the hydrophilic polymer and, for example, polystyrene (PS) is used as the hydrophobic polymer. Further, the ratio of a molecular weight of the hydrophilic polymer in the block copolymer is 20% to 40%, and the ratio of a molecular weight of the hydrophobic polymer in the block copolymer is 80% to 60%. Besides, the block copolymer is a macromolecule in which the hydrophilic polymer and the hydrophobic polymer are linearly combined, and is obtained by making the compound of the hydrophilic polymer and the hydrophobic polymer into a solution by using a solvent.

Further, the neutral layer formed on the wafer W in the neutral layer forming apparatus 33 has an intermediate affinity to the hydrophilic polymer and the hydrophobic polymer. In this embodiment, for example, a random copolymer or an alternating copolymer of polymethyl methacrylate and polystyrene is used as the neutral layer. Hereinafter, "neutral" means the case having the intermediate affinity to the hydrophilic polymer and the hydrophobic polymer as described above.

For example, in the second block G2, as illustrated in FIG. 3, thermal treatment apparatuses 40 each of which performs a thermal treatment on the wafer W, ultraviolet irradiation apparatuses 41 as modification treatment apparatuses each of which irradiates the block copolymer on the wafer W with an ultraviolet ray as an energy ray to perform a modification treatment on the block copolymer, adhesion apparatuses 42 each of which performs a hydrophobic treatment on the wafer W, edge exposure apparatuses 43 each of which exposes the outer peripheral portion of the wafer W, and polymer separation apparatuses 44 each of which phase-separates the block copolymer applied on the wafer W in the block copolymer coating apparatus 35 into the hydrophilic polymer and the hydrophobic polymer, are arranged side by side in the vertical direction and in the horizontal direction. The thermal treatment apparatus 40 has a hot plate which mounts and heats the wafer W thereon and a cooling plate which mounts and cools the wafer W thereon, and thereby can perform both of a heat treatment and a cooling treatment. Note that the polymer separation apparatus 44 is also an apparatus that performs a thermal treatment on the wafer W, and its configuration is the same as that of the thermal treatment apparatus 40. The ultraviolet irradiation apparatus 41 has a mounting table on which the wafer W is to be mounted and an ultraviolet irradiation unit which irradiates the wafer W on the mounting table with an ultraviolet ray with a wavelength of, for example, 172 nm. Besides, the numbers and the arrangement of the thermal treatment apparatuses 40, the ultraviolet irradiation apparatuses 41, the adhesion apparatuses 42, the edge exposure apparatuses 43, and the polymer separation apparatuses 44 can be arbitrarily selected.

For example, in the third block G3, a plurality of delivery apparatuses 50, 51, 52, 53, 54, 55, 56 are provided in order from the bottom. Further, in the fourth block G4, a plurality of delivery apparatuses 60, 61, 62 are provided in order from the bottom.

A wafer transfer region D is formed in a region surrounded by the first block G1 to the fourth block G4 as illustrated in FIG. 1. In the wafer transfer region D, for example, a plurality of wafer transfer apparatuses 70 are arranged each of which has a transfer arm that is movable, for example, in the Y-direction, the X-direction, the θ-direction, and the vertical direction. The wafer transfer apparatus 70 can move in the wafer transfer region D to transfer the wafer W to a predetermined apparatus in the first block G1, the second block G2, the third block G3 and the fourth block G4 therearound.

Further, in the wafer transfer region D, a shuttle transfer apparatus 80 is provided which linearly transfers the wafer W between the third block G3 and the fourth block G4.

The shuttle transfer apparatus 80 is configured to be linearly movable, for example, in the Y-direction. The shuttle transfer apparatus 80 can move in the Y-direction while supporting the wafer W, and transfer the wafer W between the delivery apparatus 52 in the third block G3 and the delivery apparatus 62 in the fourth block G4.

As illustrated in FIG. 1, a wafer transfer apparatus 100 is provided adjacent on the X-direction positive direction side of the third block G3. The wafer transfer apparatus 100 has a transfer arm that is movable, for example, in the X-direction, the θ-direction, and the vertical direction. The wafer transfer apparatus 100 can move up and down while supporting the wafer W to transfer the wafer W to each of the delivery apparatuses in the third block G3.

In the interface station 13, a wafer transfer apparatus 110 and a delivery apparatus 111 are provided. The wafer transfer apparatus 110 has a transfer arm that is movable, for example, in the Y-direction, the θ-direction, and the vertical direction. The wafer transfer apparatus 110 can transfer the wafer W to/from each of the delivery apparatuses in the fourth block G4, the delivery apparatus 111 and the exposure apparatus 12, for example, while supporting the wafer W by the transfer arm.

Figure 4:
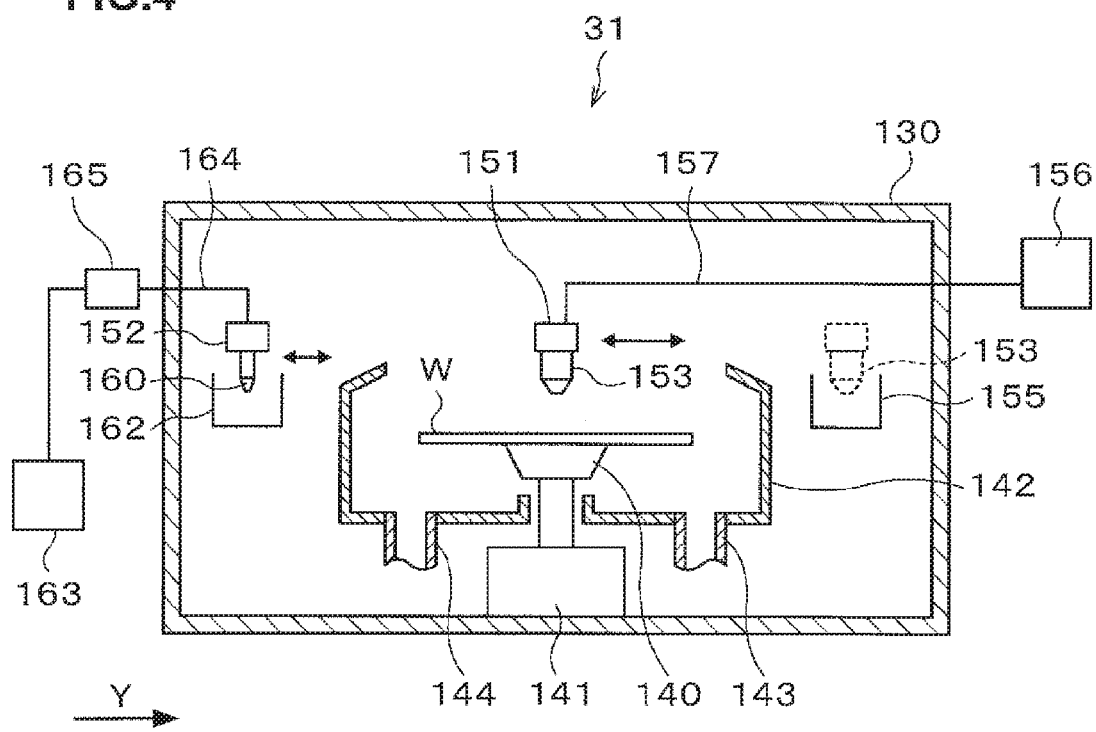
FIG. 4 A longitudinal sectional view illustrating the outline of a configuration of an organic solvent supply apparatus.

Next, the configuration of the aforementioned organic solvent supply apparatus 31 will be described. The organic solvent supply apparatus 31 has a treatment container 130 as illustrated in FIG. 4. In a side surface of the treatment container 130, a transfer-in/out port (not illustrated) for the wafer W is formed.

In the treatment container 130, a spin chuck 140 is provided which holds and rotates the wafer W thereon. The spin chuck 140 can rotate at a predetermined speed by means of a chuck drive unit 141 such as a motor.

Around the spin chuck 140, a cup 142 is provided which receives and collects liquid splashing or dropping from the wafer W. A drain pipe 143 that drains the collected liquid and an exhaust pipe 144 that exhausts the atmosphere in the cup 142 are connected to the lower surface of the cup 142.

Figure 5:
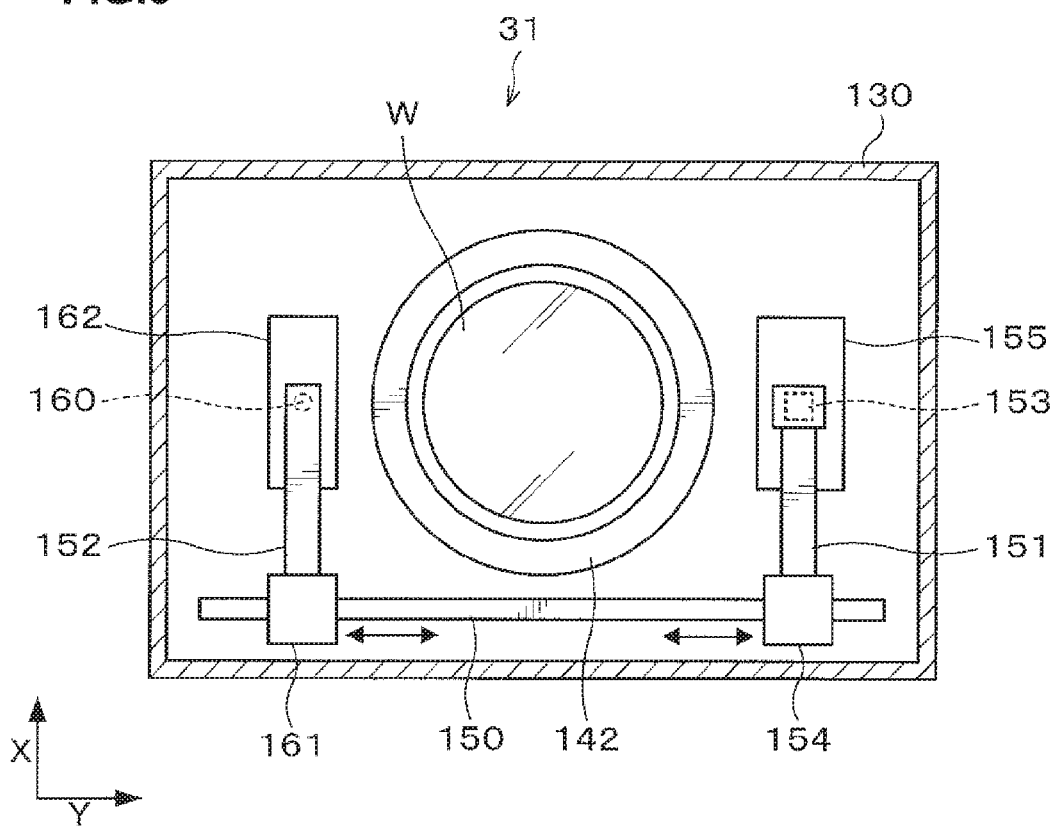
FIG. 5 A transverse sectional view illustrating the outline of the configuration of the organic solvent supply apparatus.

As illustrated in FIG. 5, on an X-direction negative direction (lower direction in FIG. 5) side of the cup 142, a rail 150 extending along a Y-direction (right-left direction in FIG. 5) is formed. The rail 150 is formed, for example, from a Y-direction negative direction (left direction in FIG. 5) side outer position of the cup 142 to a Y-direction positive direction (right direction in FIG. 5) side outer position. To the rail 150, two arms 151, 152 are attached.

On the first arm 151, a first supply nozzle 153 as a first supply unit is supported which supplies a first polar organic solvent. The first arm 151 is movable on the rail 150 by means of a nozzle drive unit 154 illustrated in FIG. 5. Thus, the first supply nozzle 153 can move from a waiting section 155 provided at the Y-direction positive direction side outer position of the cup 142 to a position above a central portion of the wafer W in the cup 142, and further move in a diameter direction of the wafer W above the front surface of the wafer W. Further, the first arm 151 can freely rise and lower by means of the nozzle drive unit 154 and thereby adjust the height of the first supply nozzle 153.

To the first supply nozzle 153, a first solvent supply pipe 157 is connected which communicates with a first solvent supply source 156 as illustrated in FIG. 4. In this embodiment, as the first polar organic solvent supplied from the first solvent supply source 156, for example, IPA, acetone, ethanol, or acetone is used which has a polarity and is suitable for dissolving the hydrophilic polymer contained in the block copolymer (the solubility of the hydrophilic polymer in the first polar organic solvent is high).

On the second arm 152, a second supply nozzle 160 as a second supply unit is supported which supplies a second polar organic solvent. The second arm 152 is movable on the rail 150 by means of a nozzle drive unit 161 illustrated in FIG. 5, and can move the second supply nozzle 160 from a waiting section 162 provided at the Y-direction positive direction side outer position of the cup 142 to a position above a central portion of the wafer W in the cup 142. Further, the second arm 152 can freely rise and lower by means of the nozzle drive unit 161 and thereby adjust the height of the second supply nozzle 160.

To the second supply nozzle 160, a second solvent supply pipe 164 is connected which communicates with a second solvent supply source 163 as illustrated in FIG. 4. In this embodiment, as the second polar organic solvent supplied from the second solvent supply source 163, for example, methyl isobutyl carbinol (MIBC), or dibasic acid ester is used which has a polarity and is higher in boiling point than water.

The configurations of the developing apparatus 30, the anti-reflection film forming apparatus 32, the neutral layer forming apparatus 33, the resist coating apparatus 34, and the block copolymer coating apparatus 35 which are the other solution treatment apparatuses are the same as that of the above-described organic solvent supply apparatus 31 except that the solution to be supplied from the nozzle is different, and therefore description thereof is omitted.

Next, the selection of the first polar organic solvent and the second polar organic solvent will be described together with the principle of the present invention. The hydrophilic polymer contained in the block copolymer according to this embodiment has a polarity and is therefore high in solubility in an organic solvent having a polarity (polar organic solvent). On the other hand, the hydrophobic polymer is nonpolar and is therefore low in solubility in an organic solvent having a polarity. When the block copolymer after being phase-separated into the hydrophilic polymer and the hydrophobic polymer is irradiated with the ultraviolet ray as the energy ray, a bonding chain of polymethyl methacrylate being the hydrophilic polymer is cut by the energy of the ultraviolet ray. Thus, the hydrophilic polymer further increases in solubility in the polar organic solvent. Further, in polystyrene being the hydrophobic polymer, a crosslinking reaction occurs by the energy of the ultraviolet ray.

Therefore, the hydrophobic polymer being nonpolar further decreases in solubility in the polar organic solvent. Accordingly, the polar organic solvent, when supplied to the block copolymer after ultraviolet irradiation, can successfully dissolve and remove only the hydrophilic polymer. Note that as the energy ray, an electron beam can be used besides the ultraviolet ray.

From the viewpoint of the dissolution and removal of the hydrophilic polymer, it is preferable to select, as the polar organic solvent to be supplied to the block copolymer after ultraviolet irradiation, a polar organic solvent having a high degree of dissolving the hydrophilic polymer, and examples of the polar organic solvent fulfilling this condition include IPA, acetone, ethanol, and acetone as described above.

Note that the polar organic solvents such as IPA, acetone, ethanol, and acetone have common properties such as a high degree of dissolving water and a lower boiling point than that of water. Accordingly, when the polar organic solvents are supplied to the block copolymer on the wafer W and then the polar organic solvents are dried, the temperature around the wafer W decreases due to heat of evaporation, whereby moisture in the air condenses and dissolves into the polar organic solvents. Then, the polar organic solvents are lower in boiling point than water and therefore evaporate before water, whereby the moisture concentration in the polar organic solvents increases, resulting in an increase in moisture concentration in the polar organic solvents so that a part of the hydrophilic polymer dissolved therein precipitates to cause watermarks.

Note that the present inventors carried out a confirmation test in order to confirm that the cause of the watermarks is moisture in the air. As the confirmation test, it was tried to dissolve and remove the hydrophilic polymer by the first polar organic solvent, for example, in a nitrogen atmosphere as an atmosphere containing no moisture in the air. In this case, it is predicted that any watermark is not generated since there is no dissolution of water in the air into the first polar organic solvent, and any watermark was not generated on the wafer W after supply of the first polar organic solvent, as predicted, also in the test result. From this result, it has been confirmed that the cause of the watermarks is the moisture in the air.

Accordingly, it is considered to supply, at the time when dissolving and removing the hydrophilic polymer using the first polar organic solvent, the first polar organic solvent, for example, in the nitrogen atmosphere to prevent the moisture from dissolving into the first polar organic solvent. However, bringing the whole apparatus that dissolves and removes the hydrophilic polymer into the nitrogen atmosphere is costly.

Figure 6:
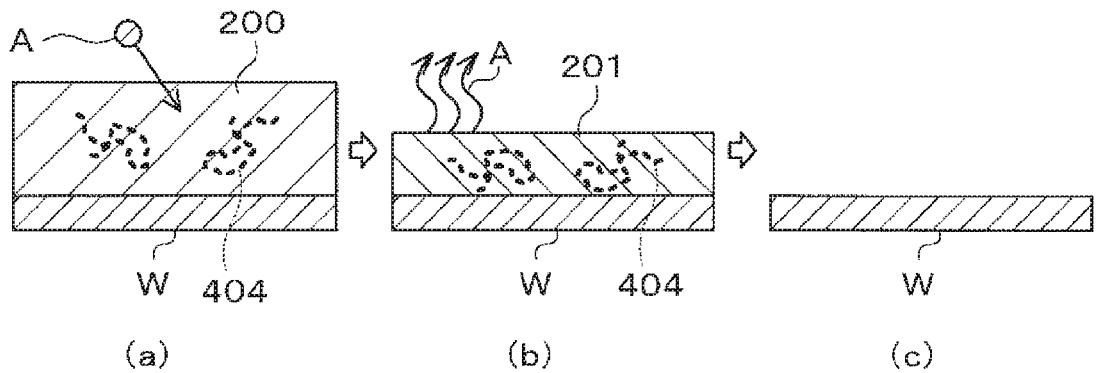
FIG. 6 An explanatory view illustrating appearances in which a first polar organic solvent and a second polar organic solvent are supplied in sequence to a wafer, (a) illustrating a state in which the first polar organic solvent is supplied onto the wafer to dissolve the hydrophilic polymer, (b) illustrating a state in which the second polar organic solvent is supplied onto the wafer to substitute for the first polar organic solvent, and (c) illustrating a state in which the second organic solvent is discharged from the top of the wafer.

Hence, the present inventors considered that it is possible to prevent an increase in moisture concentration in the first polar organic solvent by supplying a polar organic solvent such as IPA as the first polar organic solvent to dissolve the hydrophilic polymer, then supplying an organic solvent higher in boiling point than water and capable of dissolving the hydrophilic polymer as the second polar organic solvent. More specifically, even if moisture A dissolves into a first polar organic solvent 200 as illustrated in FIG. 6(a), the first polar organic solvent 200 is substituted by a second polar organic solvent 201 as illustrated in FIG. 6(b), thereby making it possible to prevent the second polar organic solvent 201 from drying before water. In this case, it is possible to prevent an increase in moisture concentration in a solution in which the first polar organic solvent 200 and the second polar organic solvent 201 are mixed together, or in the second polar organic solvent 201 after substitution. As a result, a hydrophilic polymer 404 never precipitates in the second polar organic solvent 201, and it is possible, as illustrated in FIG. 6(c), to prevent the hydrophilic polymer 404 from precipitating and remaining on the wafer after the second polar organic solvent 201 is discharged from the top of the wafer W to cause watermarks. The present invention is based on such knowledge. Note that as the second polar organic solvent 201, methyl isobutyl carbinol (MIBC) or dibasic acid ester is used as described above.

Note that to prevent the precipitation of the hydrophilic polymer 404, it is only necessary to use a polar organic solvent which has a degree of dissolving the hydrophilic polymer 404, for example, equal to that of IPA and is higher in boiling point than water, or into which water hardly dissolves, but such a polar organic solvent does not exist at present. Further, the solubility of the hydrophilic polymer 404 in the second polar organic solvent 201 higher in boiling point than water such as MIBC is generally lower than the solubility of the hydrophilic polymer 404 in the first polar organic solvent 200, so that it is impossible to successfully dissolve and remove the hydrophilic polymer 404 using only the second polar organic solvent 201. Accordingly, in this embodiment, first, the first polar organic solvent 200 is supplied to dissolve the hydrophilic polymer 404.

Further, as another method of preventing the precipitation of the hydrophilic polymer 404 accompanying the increase in moisture concentration in the first polar organic solvent 200, it is conceivable to continuously supply the first polar organic solvent 200 to the wafer W to prevent an increase in moisture concentration. However, the organic solvent to be used as the first polar organic solvent 200 has a low energy difference from the neutral layer formed as a base film of the block copolymer and has good wettability with the neutral layer, and is therefore difficult to be discharged from the upper surface of the wafer W. Therefore, it is preferable, from the viewpoint of the throughput, to supply a solution having an energy difference from the neutral layer larger than that of the first polar organic solvent 200, rather than continuously supplying the first polar organic solvent 200, to thereby rinse cleaning the first polar organic solvent 200 and the hydrophilic polymer 404 dissolved in the first polar organic solvent 200, using another solution. Also from this point, it is preferable to supply the first polar organic solvent 200 and then supply the second polar organic solvent 201 as in this embodiment.

In the above substrate treatment system 1, a control unit 300 is provided as illustrated in FIG. 1. The control unit 300 is, for example, a computer and has a program storage unit (not illustrated). In the program storage unit, a program that controls the treatments on the wafer W in the substrate treatment system 1 is stored. Further, the program storage unit also stores a program that controls the operations of the above-described various treatment apparatuses and a driving system such as the transfer apparatuses to realize a later-described substrate treatment in the substrate treatment system 1. Note that the programs may be the ones which are recorded, for example, in a computer-readable storage medium such as a computer-readable hard disk (HD), flexible disk (FD), compact disk (CD), magneto-optical disk (MO), or memory card, and installed from the storage medium into the control unit 300.

Figure 7:
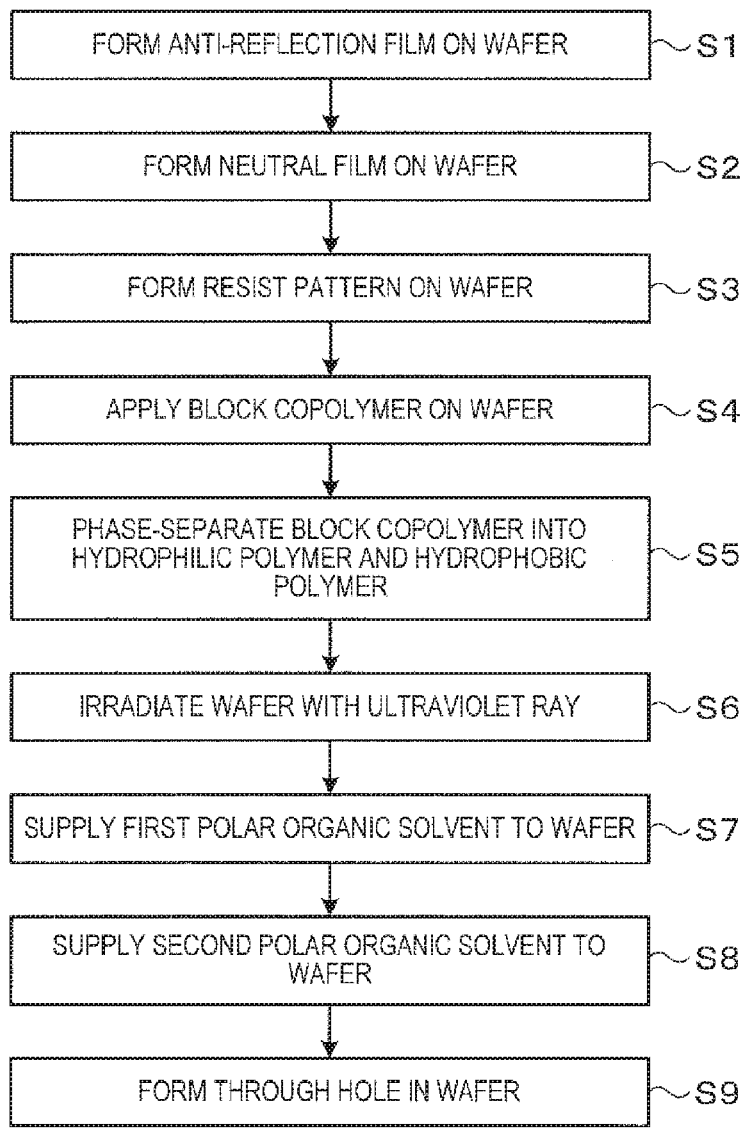
FIG. 7 A flowchart illustrating main steps of a wafer treatment.

Next, a wafer treatment performed using the substrate treatment system 1 configured as described above will be described. FIG. 7 is a flowchart illustrating examples of main steps of the wafer treatment.

First, the cassette C housing a plurality of wafers W is transferred into the cassette station 10 of the substrate treatment system 1 and the wafers W in the cassette C are sequentially transferred by the wafer transfer apparatus 23 to the delivery apparatus 53 in the treatment station 11.

Figure 8:
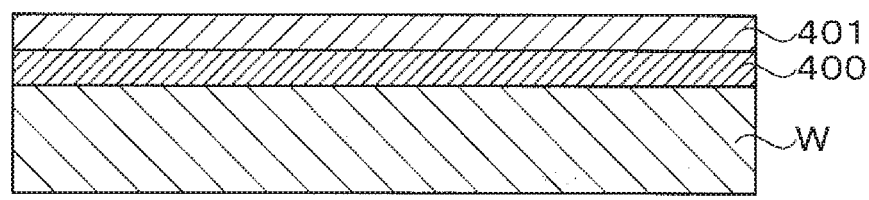
FIG. 8 An explanatory view of a longitudinal cross-section illustrating an appearance in which an anti-reflection film and a neutral layer are formed on the wafer.

The wafer W is then transferred by the wafer transfer apparatus 70 to the thermal treatment apparatus 40 and temperature-regulated. Thereafter, the wafer W is transferred by the wafer transfer apparatus 70 to the anti-reflection film forming apparatus 32, in which an anti-reflection film 400 is formed on the wafer W as illustrated in FIG. 8 (Step S1 in FIG. 7). The wafer W is then transferred to the thermal treatment apparatus 40 and heated and temperature-regulated.

The wafer W is then transferred by the wafer transfer apparatus 70 to the neutral layer forming apparatus 33. In the neutral layer forming apparatus 33, the neutralizing agent is applied onto the anti-reflection film 400 on the wafer W as illustrated in FIG. 8 to form a neutral layer 401 (Step S2 in FIG. 7). Thereafter, the wafer W is transferred to the thermal treatment apparatus 40 and heated and temperature-regulated, and then returned to the delivery apparatus 53.

The wafer W is then transferred by the wafer transfer apparatus 100 to the delivery unit 54. Thereafter, the wafer W is transferred by the wafer transfer apparatus 70 to the adhesion unit 42 and subjected to an adhesion treatment. The wafer W is then transferred by the wafer transfer apparatus 70 to the resist coating apparatus 34, in which the resist solution is applied onto the neutral layer 401 of the wafer W to form a resist film. Thereafter, the wafer W is transferred by the wafer transfer apparatus 70 to the thermal treatment apparatus 40 and subjected to a pre-bake treatment. The wafer W is then transferred by the wafer transfer apparatus 70 to the delivery apparatus 55.

The wafer W is then transferred by the wafer transfer apparatus 70 to the edge exposure apparatus 43 and subjected to edge exposure processing.

Thereafter, the wafer W is transferred by the wafer transfer apparatus 110 in the interface station 13 to the exposure apparatus 12 and subjected to exposure processing.

Figure 9:
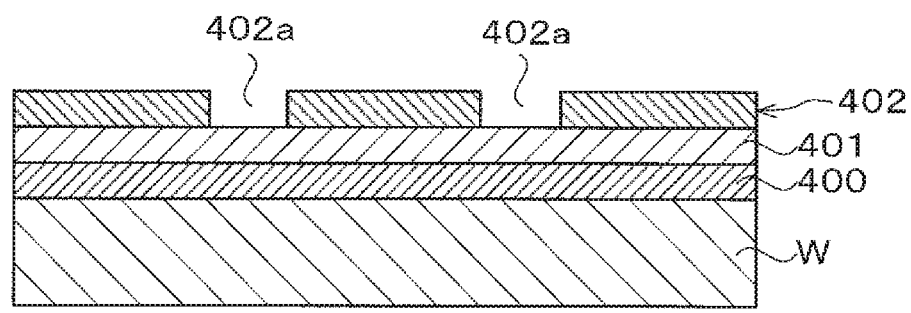
FIG. 9 An explanatory view of a longitudinal cross-section illustrating an appearance in which a resist pattern is formed on the neutral layer.

The wafer W is then transferred by the wafer transfer apparatus 70 to the thermal treatment apparatus 40 and subjected to a post-exposure bake treatment. The wafer W is thereafter transferred by the wafer transfer apparatus 70 to the developing apparatus 30 and developed. After the development ends, the wafer W is transferred by the wafer transfer apparatus 70 to the thermal treatment apparatus 40 and subjected to a post-bake treatment. Thus, a predetermined resist pattern 402 is formed on the neutral layer 401 of the wafer W as illustrated in FIG. 9 (Step S3 in FIG. 7). In this embodiment, the resist pattern 402 is a pattern in which circular hole portions 402a are arranged in a predetermined arrangement in a plan view. Note that the width of the hole portion 402a is set so that the hydrophilic polymer and the hydrophobic polymer are concentrically arranged in the hole portion 402a as will be described later.

Figure 10:
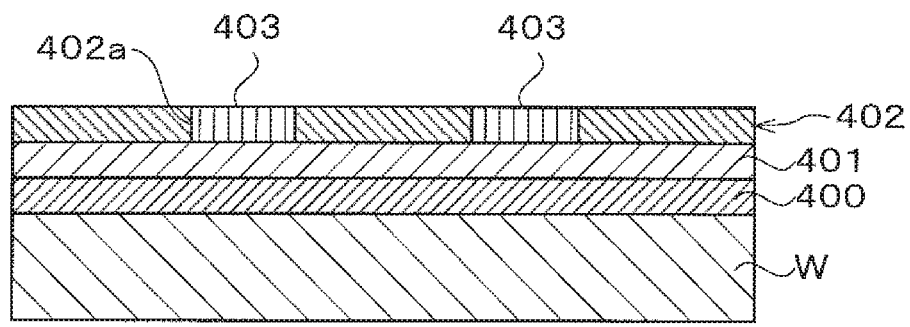
FIG. 10 An explanatory view of a longitudinal cross-section illustrating an appearance in which a block copolymer is applied to hole portions of a resist pattern.

The wafer W is then transferred by the wafer transfer apparatus 70 to the block copolymer coating apparatus 35. In the block copolymer coating apparatus 35, a block copolymer 403 is applied onto the anti-reflection film 400 and the resist pattern 402 of the wafer W as illustrated in FIG. 10 (Step S4 in FIG. 7).

Figure 11:
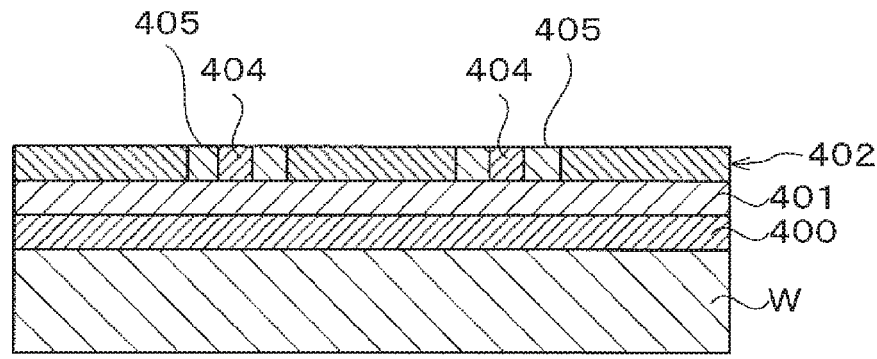
FIG. 11 An explanatory view of a longitudinal cross-section illustrating an appearance in which the block copolymer is phase-separated into a hydrophilic polymer and a hydrophobic polymer.
Figure 12:
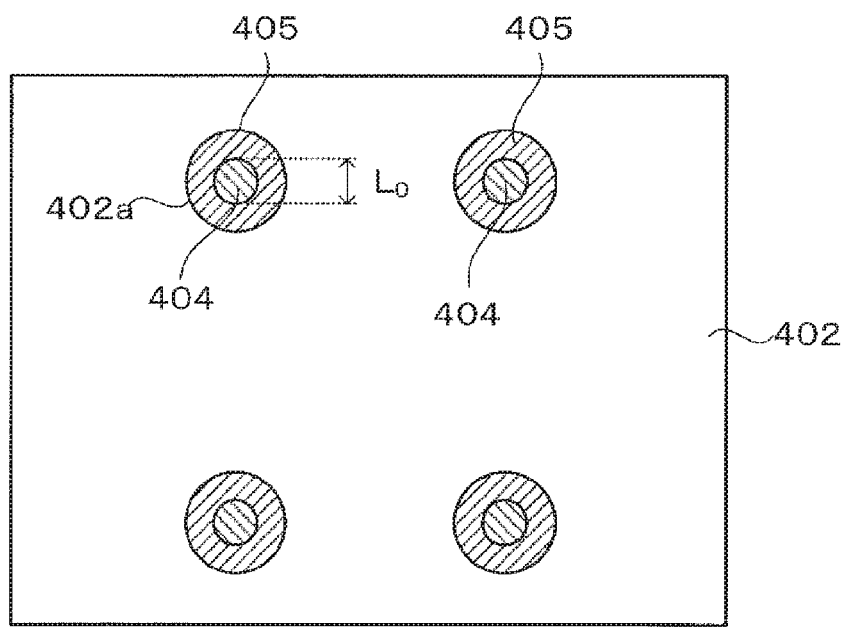
FIG. 12 An explanatory view of a plane illustrating an appearance in which the block copolymer is phase-separated into the hydrophilic polymer and the hydrophobic polymer.

The wafer W is then transferred by the wafer transfer apparatus 70 to the thermal treatment apparatus 40. In the thermal treatment apparatus 40, a thermal treatment at a predetermined temperature is performed on the wafer W. Then, as illustrated in FIG. 11 and FIG. 12, the block copolymer 403 on the wafer W is phase-separated into the hydrophilic polymer 404 and a hydrophobic polymer 405

(Step S5 in FIG. 7). Here, as described above, the ratio of a molecular weight of the hydrophilic polymer 404 in the block copolymer 403 is 20% to 40%, and the ratio of a molecular weight of the hydrophobic polymer 405 is 80% to 60%. Then, at Step S5, as illustrated in FIG. 11 and FIG. 12, the columnar hydrophilic polymer 404 and the cylindrical hydrophobic polymer 405 are concentrically phase-separated in the hole portion 402a of the resist pattern 402.

The wafer W is then transferred by the wafer transfer apparatus 70 to the ultraviolet irradiation apparatus 41. In the ultraviolet irradiation apparatus 41, the wafer W is irradiated with the ultraviolet ray, and thereby the bonding chain of polymethyl methacrylate being the hydrophilic polymer 404 is cut and polystyrene being the hydrophobic polymer 405 is subjected to a cross-linking reaction (Step S6 in FIG. 7).

The wafer W is then transferred by the wafer transfer apparatus 70 to the organic solvent supply apparatus 31. In the organic solvent supply apparatus 31, the first polar organic solvent 200 is supplied to the wafer W from the first supply nozzle 153 (Step S7 in FIG. 7). This dissolves the hydrophilic polymer 404 whose bonding chain has been cut by the ultraviolet irradiation. After a lapse of a predetermined time after the supply of the first polar organic solvent 200, for example, after a lapse of 20 seconds to 40 seconds in this embodiment, the second polar organic solvent 201 is supplied to the wafer W from the second supply nozzle 160 (Step S8 in FIG. 7). Thus, the first polar organic solvent 200 lower in boiling point than water and the second polar organic solvent 201 is gradually substituted by the second polar organic solvent 201 due to evaporation. Note that the supply of the first polar organic solvent 200 may be stopped concurrently with start of the supply of the second polar organic solvent 201 or stopped after a lapse of a predetermined time after the supply of the second polar organic solvent 201. The predetermined time after the supply of the first polar organic solvent 200 to the start of the supply of the second polar organic solvent 201 is decided by a test performed beforehand or the like.

Figure 13:
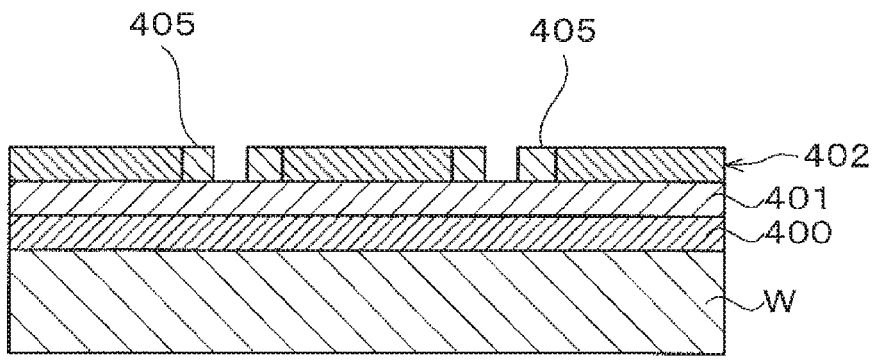
FIG. 13 An explanatory view of a longitudinal cross-section illustrating an appearance in which the hydrophilic polymer is removed.

After a lapse of a predetermined time after all of the first polar organic solvent 200 on the wafer W is substituted by the second polar organic solvent 201, for example, after a lapse of 20 seconds to 40 seconds in this embodiment, the wafer W is rotated by the spin chuck 140 at a predetermined rotation speed. Thus, the second polar organic solvent 201 on the wafer W is spun off in the outer peripheral direction of the wafer W, and the hydrophilic polymer 404 dissolved in the second polar organic solvent 201 as illustrated in FIG. 6(b) is discharged together with the second polar organic solvent 201 to the outside of the wafer W as illustrated in FIG. 6(c). Thereafter, the rotation of the wafer W is maintained for a predetermined time, and thereby spin drying of the wafer W is performed. In this event, since the second polar organic solvent 201 is higher in boiling point than water, the moisture concentration in the second polar organic solvent 201 does not increase during the process of the spin drying. As a result, while the precipitation of the dissolved hydrophilic polymer 404 is prevented, the hydrophilic polymer 404 is discharged out of the wafer W. When the hydrophilic polymer 404 is selectively removed in the organic solvent supply apparatus 31, a hole-shaped pattern is formed of the hydrophobic polymer 405 as illustrated in FIG. 13.

Thereafter, the wafer W is transferred by the wafer transfer apparatus 70 to the delivery apparatus 50, and then transferred by the wafer transfer apparatus 23 in the cassette station 10 to the cassette C on the predetermined mounting plate 21.

Figure 14:
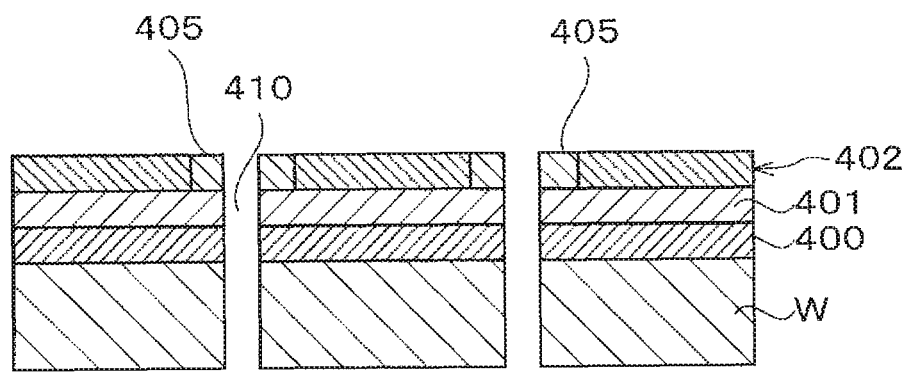
FIG. 14 An explanatory view of a longitudinal cross-section illustrating an appearance in which the wafer is subjected to an etching treatment.

Thereafter, the cassette C is transferred to an etching treatment apparatus (not illustrated) provided outside the substrate treatment system 1, and the neutral layer 401, the anti-reflection film 400, and the wafer W are subjected to an etching treatment using, for example, the hydrophobic polymer 405 as a mask, whereby a through hole, namely, a contact hole 410 is formed in the wafer W as illustrated in FIG. 14 (Step S9 in FIG. 7). Note that as the etching treatment apparatus, for example, an RIE (Reactive Ion Etching) apparatus is used. Specifically, in the etching treatment apparatus, dry etching of etching films to be treated such as the hydrophilic polymer and the anti-reflection film using reactive gas (etching gas), ions, or radicals.

Thereafter, the wafer W is subjected again to the dry-etching treatment in which the resist pattern 402 and the hydrophobic polymer 405 on the wafer are removed, with which a series of wafer treatment ends.

According to the above embodiment, the block copolymer 403 after phase separation is irradiated with the ultraviolet ray and then supplied with the first polar organic solvent 200, so that the hydrophilic polymer 404 can be successfully dissolved by the first polar organic solvent 200. Then, the second polar organic solvent 201 higher in boiling point than water is supplied, so that the first polar organic solvent 200 lower in boiling point than water is substituted by the second polar organic solvent 201 while the first polar organic solvent 200 is evaporating. As a result, moisture dissolved in the first polar organic solvent 200 evaporates before the second polar organic solvent 201 after substitution, and therefore the moisture concentration in the second organic solvent decreases. This suppresses the precipitation of the hydrophilic polymer 404. Therefore, according to the present invention, the removal of the hydrophilic polymer 404 is successfully performed, so that a predetermined pattern is appropriately formed on the wafer W.

Note that though the case of using IPA, acetone, ethanol, or acetone as the first polar organic solvent 200 has been described in the above embodiment, a mixture of two or more selected from among those organic solvents may be used as the first polar organic solvent 200. In the investigation by the present inventors, it has been confirmed that also in the case of using a mixed solution of them, the mixed solution successfully dissolves the hydrophilic polymer 404 and does not dissolve the hydrophobic polymer 405. Further, as the first polar organic solvent 200, the one made by adding methylisobutylketone (MIBK) or acetic acid to IPA may be used. It has been confirmed that also this mixed solution can successfully dissolve only the hydrophilic polymer 404.

Note that there is Hansen Solubility Parameter (HSP) as an index of solubility indicating how much a certain substance dissolves in another substance. According to this index, the substance is characterized by an energy $\delta_d$ derived from dispersion force between molecules, an energy $\delta_p$ derived from polar force between molecules, and an energy $\delta_h$ derived from hydrogen bonding strength between molecules. These three parameters are handled as one point of coordinates in a three-dimensional space called Hansen space, and the coordinates decided by these three parameters are defined as an HSP value. Further, the substance has a specific interaction radius $R_0$ and can dissolve the substance in a sphere (Hansen solubility sphere) having an HSP value with this interaction radius $R_0$. In other words, it is assumed that the distance between the HSP values of two substances is $R_a$, the substances do not dissolve when $R_a/R_0$ is larger than 1, and the substances dissolve when $R_a/R_0$ is smaller than 1. Accordingly, for the first polar organic solvent according to this embodiment, a substance having an $R_a/R_0$ smaller than 1 with respect to the hydrophilic polymer and having an $R_a/R_0$ larger than 1 with respect to the hydrophobic polymer is selected.

Table 1 lists values of $R_a/R_0$ of the above-described organic solvents with respect to polymethyl methacrylate being the hydrophilic polymer and polystyrene being the hydrophobic polymer.

TABLE 1

|  | POLYSTYRENE $R_a/R_0$ | POLYMETHYL METHACRYLATE $R_a/R_0$ |
|---|---|---|
| ETHANOL | 1.49 | 1.21 |
| IPA | 1.29 | 1.04 |
| ACETONE | 1.00 | 0.57 |
| MIBK | 0.94 | 0.79 |
| MIBK:IPA 3:7 | 1.11 | 0.83 |
| MIBK:IPA 5:5 | 1.02 | 0.73 |

In Table 1, both ethanol and IPA have values of $R_a/R_0$ exceeding 1, and do not dissolve both polymethyl methacrylate and polystyrene in terms of numerals. However, the value of $R_a/R_0$ listed in Table 1 is the value before the block copolymer 403 is irradiated with the energy ray, and the present inventors presume that by the irradiation with the energy ray, polymethyl methacrylate decreases in the value of $R_a/R_0$ due to cutting of the bonding chain, and in contrast to that, polystyrene increases in the value of $R_a/R_0$ due to crosslinking reaction. As a result, it is considered that after the irradiation with the energy ray, both ethanol and IPA become to have the values of $R_a/R_0$ with respect to polymethyl methacrylate larger than 1 and come to successfully dissolve only polymethyl methacrylate. Further, acetone has a value of $R_a/R_0$ with respect to polystyrene of 1 and a smaller value of $R_a/R_0$ with respect to polymethyl methacrylate, and therefore is considered to be able to dissolve both polystyrene and polymethyl methacrylate in the block copolymer before the irradiation with the energy ray, and come to successfully dissolve only polymethyl methacrylate by the irradiation with the energy ray as in the case of ethanol and IPA.

Further, when two substances are mixed together, the HSP value takes a value between those of both substances according to the mixture ratio between them. As an example, when the two substances are mixed together at a ratio of 1:1, the HSP value becomes almost the intermediate value between those of both substances. Therefore, ethanol, IPA, and acetone, even if mixed together at any mixture ratio, have a value of $R_a/R_0$ with respect to polymethyl methacrylate after the irradiation with the energy ray smaller than 1 and a value of $R_a/R_0$ with respect to polystyrene larger than 1, and thereby can successfully dissolve only the polymethyl methacrylate.

Further, the MIBK by itself has both values of $R_a/R_0$ with respect to polymethyl methacrylate and polystyrene smaller than 1 and therefore cannot take a selection ratio to polymethyl methacrylate and polystyrene, so that MIBK cannot be used by itself as the first polar organic solvent 200. However, it can be confirmed, also from Table 1, that MIBK mixed with IPA at a predetermined ratio becomes to have a value of $R_a/R_0$ with respect to polystyrene larger than 1, and thereby becomes to be able to selectively dissolve only polymethyl methacrylate. Further, the degree of MIBK dissolving water is lower than the degree of IPA dissolving water, so that the degree of a mixed solution of MIBK and IPA dissolving water becomes lower that of IPA. Therefore, using the mixed solution of MIBK and IPA as the first polar organic solvent 200 makes water dissolving into the first polar organic solvent 200 less than that in the case of using IPA. As a result, it is possible to further reduce the watermarks. In addition, the boiling point of MIBK is 116.2° C. that is higher than that of water, so that mixing MIBK with IPA can make the boiling point of the mixed solution higher than that of the case of IPA by itself. Accordingly, it is possible to further reduce the watermarks also from this point. Note that the mixture ratio between MIBK and IPA is preferably between 1:9 and 3:7 in mass ratio.

Note that acetic acid has a high boiling point of 118° C. that is higher than that of water, similarly to MIBK, and therefore its mixed solution with IPA is used as the first polar organic solvent 200, thereby making it possible to reduce the watermarks. Note that acetic acid has a property of dissolving the resist pattern 402, and therefore preferably mixed with IPA at a ratio not dissolving the resist pattern 402 when the resist pattern 402 is used as the guide of the block copolymer 403.

Note that the present inventors have confirmed that acetic acid, by being supplied to the block copolymer after the irradiation with the energy ray, can selectively dissolve only polymethyl methacrylate even if acetic acid is used by itself, but a residual product of polymethyl methacrylate is generated which causes a defect on the wafer W. Accordingly, it is preferable to perform rinse cleaning after polymethyl methacrylate is dissolved with acetic acid, but if pure water is used as the rinse solution, watermarks due to the residual product may be generated. Therefore, in the case of using acetic acid as the first polar organic solvent 200, it is preferable to use, for example, MIBC for the second polar organic solvent 201 as the rinse solution. Further, in consideration of the residual product, it is more preferable to mix acetic acid with IPA and use a resultant mixture as the first polar organic solvent 200, and then perform rinse cleaning with MIBC as the second polar organic solvent 201.

The first polar organic solvent 200 is supplied to dissolve the hydrophilic polymer 404 and then the second polar organic solvent 201 is supplied to discharge the first polar organic solvent 200 and the hydrophilic polymer 404 dissolved therein from the wafer W in the above embodiment, but a dry gas containing no moisture, for example, nitrogen or the like may be sprayed to the wafer W instead of the second polar organic solvent 201, from the viewpoint of discharging the first polar organic solvent 200 and the hydrophilic polymer 404 dissolved therein from the wafer W.

Figure 15:
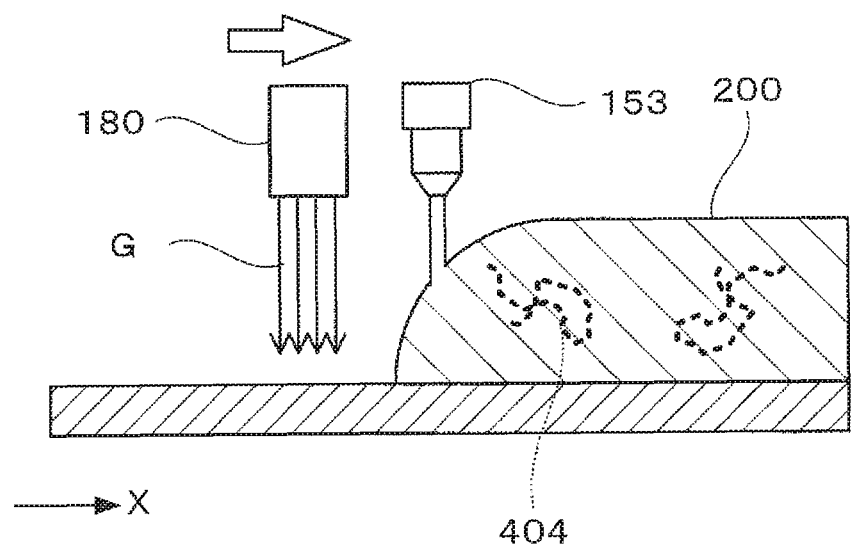
FIG. 15 An explanatory view illustrating an appearance in which the first polar organic solvent is removed from the top of the wafer by a dry gas.
Figure 16:
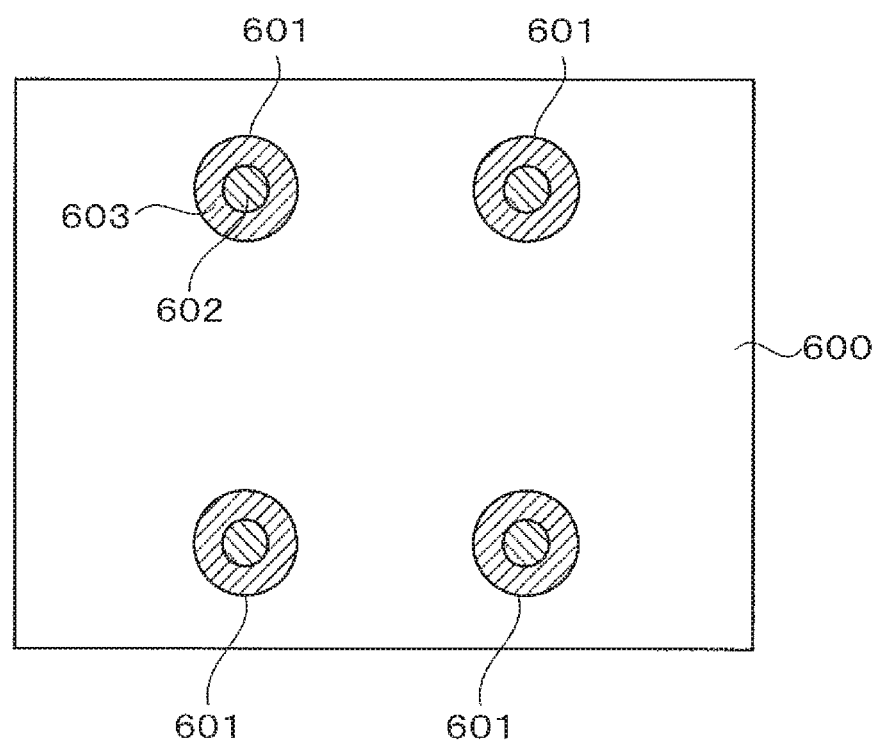
FIG. 16 An explanatory view of a longitudinal cross-section illustrating an appearance in which the block copolymer is phase-separated into the hydrophilic polymer and the hydrophobic polymer in a conventional water treatment.
Figure 17:
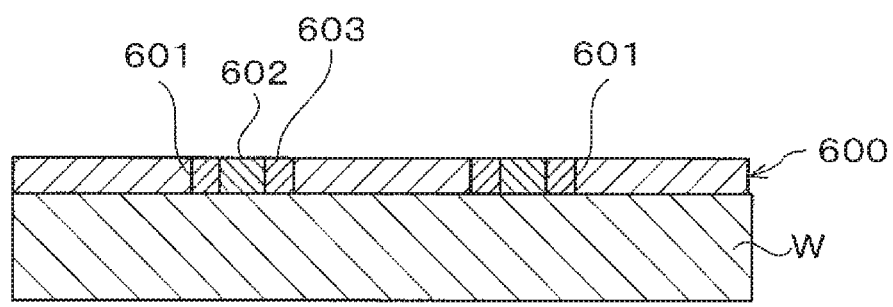
FIG. 17 An explanatory view of a longitudinal cross-section illustrating an appearance in which a pattern of the hydrophobic polymer is formed on the wafer in the conventional water treatment.
Figure 18:
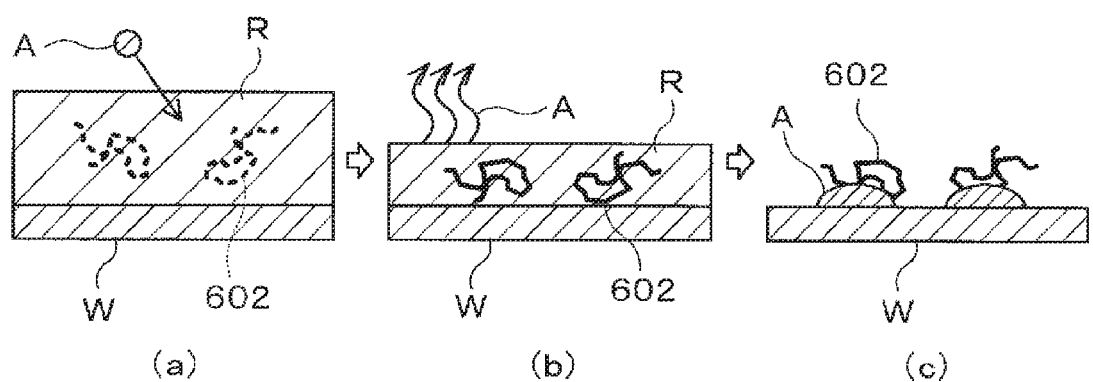
FIG. 18 An explanatory view illustrating change over time when irradiating the phase-separated block copolymer with an ultraviolet ray and then supplying isopropyl alcohol thereto, (a) illustrating a state in which the first polar organic solvent is supplied onto the wafer to dissolve the hydrophilic polymer, (b) illustrating a state in which the first polar organic solvent on the wafer evaporates and the hydrophilic polymer precipitates, and (c) illustrating a state in which the precipitated hydrophilic polymer remains on the wafer.

In this case, a gas supply nozzle 180 that supplies a dry gas G to the organic solvent supply apparatus 31 is provided and the gas supply nozzle 180 is moved toward an outer peripheral direction (an X-direction positive direction in FIG. 15) of the wafer W as illustrated in, for example, FIG. 15, thereby making it possible to discharge the first polar organic solvent 200 supplied from the first supply nozzle 153 to the outside of the wafer W. For example, when spin drying is performed after the supply of the first polar organic solvent 200, the first polar organic solvent 200 not spun off by the centrifugal force but remaining on the wafer W gradually dries to generate watermarks as has been described. However, fluid such a dry gas is sprayed in such a manner to instantaneously discharge the first polar organic solvent 200 from the top of the wafer W, thereby avoiding the gradual drying of the first polar organic solvent 200 on the wafer W as in the spin drying. Accordingly, it is possible to remove the first polar organic solvent from the wafer W before the moisture concentration in the first polar organic solvent 200 increases, and to prevent generation of watermarks as a result.

Further, in a point that the fluid is used to discharge the first polar organic solvent 200 on the wafer W, for example, tetramethylammonium hydroxide (TMAH) used for development of the resist may be supplied instead of the second polar organic solvent 201. Since tetramethylammonium hydroxide is alkaline and therefore can successfully wash away the hydrophilic polymer 404 dissolved in the first polar organic solvent 200 without allowing the hydrophilic polymer 404 to adhere to the wafer W. In the case where a TMAH solution is supplied instead of the second polar organic solvent, it is preferable to perform rinse cleaning on the wafer W by supplying the first polar organic solvent again after the supply of the TMAH solution in order to keep the upper surface of the wafer W clean. Note that for the rinse cleaning, for example, pure water may be used instead of the first polar organic solvent.

Note that the hole-shaped pattern in which the hydrophilic polymer 404 and the hydrophobic polymer 405 are concentrically separated has been described as an example in the above embodiment, but the present invention is applicable in various situations, and is also applicable, for example, to a lamellar structure in which the hydrophilic polymer 404 and the hydrophobic polymer 405 after phase separation are linearly and alternately arranged. In the case of the lamellar structure, the ratio of a molecular weight of the hydrophilic polymer 404 in the block copolymer 403 is 40% to 60%, and the ratio of a molecular weight of the hydrophobic polymer 405 is 60% to 40%.

Note that though the guide for pattern formation by the block copolymer 403 is formed by the resist pattern 402 in the above embodiment, the guide does not always need to be formed by the resist pattern but may be formed by the neutral layer 401 formed in a predetermined pattern or the hydrophilic polymer 404 and the hydrophobic polymer 405 formed in a predetermined pattern.

A preferred embodiment of the present invention has been described above with reference to the accompanying drawings, but the present invention is not limited to the embodiment. It should be understood that various changes and modifications are readily apparent to those skilled in the art within the scope of the spirit as set forth in claims, and those should also be covered by the technical scope of the present invention. The present invention is not limited to the embodiment but can take various forms. The present invention is also applicable to the case where the substrate is a substrate other than the wafer, such as an FPD (Flat Panel Display), a mask reticle for a photomask or the like.

INDUSTRIAL APPLICABILITY

The present invention is useful in treating a substrate, for example, using a block copolymer containing a hydrophilic polymer having a hydrophilic property and a hydrophobic polymer having a hydrophobic property.

EXPLANATION OF CODES 1 substrate treatment system
30 developing apparatus
31 organic solvent supply apparatus
32 anti-reflection film forming apparatus
33 neutral layer forming apparatus
34 resist coating apparatus
35 block copolymer coating apparatus
40 thermal treatment apparatus
200 first polar organic solvent
201 second polar organic solvent
300 control unit
400 anti-reflection film
401 neutral layer
402 anti-reflection film
403 block copolymer
404 hydrophilic polymer
405 hydrophobic polymer
W wafer

What is claimed:

1. A method of treating a substrate using a block copolymer containing a hydrophilic polymer and a hydrophobic polymer, the substrate treatment method comprising:
   a neutral layer forming step of forming, on the substrate, a neutral layer having an intermediate affinity to the hydrophilic polymer and the hydrophobic polymer;
   a resist pattern forming step of performing exposure processing on a resist film formed on the neutral layer, and then developing the resist film after the exposure processing to form a resist pattern;
   a block copolymer coating step of applying the block copolymer to the substrate after formation of the resist pattern;
   a polymer separation step of phase-separating the block copolymer into the hydrophilic polymer and the hydrophobic polymer; and
   a polymer removal step of selectively removing the hydrophilic polymer from the phase-separated block copolymer,
   wherein in the polymer removal step, the hydrophilic polymer is removed by:
     irradiating the phase-separated block copolymer with an energy ray;
     then supplying a first polar organic solvent having a first degree of dissolving the hydrophilic polymer, being lower in boiling point than water and capable of dissolving water, and not dissolving the hydrophobic polymer, to the block copolymer; and
     then supplying a second polar organic solvent having a second dissolving degree lower than the first dissolving degree, being higher in boiling point than water, and not dissolving the hydrophobic polymer, to the block copolymer.

2. The substrate treatment method according to claim 1, wherein the first polar organic solvent and the second polar organic solvent are soluble in each other.

3. The substrate treatment method according to claim 1, wherein the first polar organic solvent is one of IPA, acetone, and ethanol.

4. The substrate treatment method according to claim 1, wherein the second polar organic solvent is MIBC.

5. The substrate treatment method according to claim 1, wherein the hydrophilic polymer is polymethyl methacrylate, and
wherein the hydrophobic polymer is polystyrene.

* * * * *